United States Patent [19]

Furutani et al.

[11] Patent Number: 4,849,938

[45] Date of Patent: Jul. 18, 1989

[54] SEMICONDUCTOR MEMORY DEVICE

[75] Inventors: Kiyohiro Furutani; Koichiro Mashiko; Kazutami Arimoto; Noriaki Matsumoto; Yoshio Matsuda, all of Itami, Japan

[73] Assignee: Mitsubishi Denki Kabushiki Kaisha, Tokyo, Japan

[21] Appl. No.: 76,401

[22] Filed: Jul. 22, 1987

[30] Foreign Application Priority Data

Jul. 31, 1986 [JP] Japan ................................ 61-180600

[51] Int. Cl.[4] .............................................. G11C 7/00
[52] U.S. Cl. ..................................... 371/10; 365/203; 365/200; 365/230.08
[58] Field of Search ...................... 365/200, 230, 203; 371/10, 21

[56] References Cited

U.S. PATENT DOCUMENTS 4,723,227 2/1988 Murotani ............................ 365/200

FOREIGN PATENT DOCUMENTS 61-8520 3/1986 Japan .

OTHER PUBLICATIONS

Electronics/Jul. 28, 1981, pp. 127–130; "Equipping a Line of Memories with Spare Cells", Abbott et al.

*Primary Examiner*—Joseph A. Popek
*Attorney, Agent, or Firm*—Fleit, Jacobson, Cohn, Price, Holman & Stern

[57] ABSTRACT

In a semiconductor memory device of a redundancy configuration having lines (rows or columns) of main memory cells and a line of spare memory cells made to substitute a defective line responsive to the address of the defective line, a comparator compares an address input to the memory device, with the address of the defective line which has been programmed in it, and a spare line selector selects the spare line when the input address is found to coincide with the programmed address. A line decoder is responsive to the input address for selecting one of the lines of the normal memory cells, and is inactivated by the output of the comparator when the input address is found to coincide with the programmed address. An input address to the line decoder is applied before the same input address is applied to the comparator.

16 Claims, 6 Drawing Sheets

SEMICONDUCTOR MEMORY DEVICE

BACKGROUND OF THE INVENTION

The present invention relates to a semiconductor memory device of a redundancy configuration enabling substitution for defective bits or memory cells, and particularly to an improvement for preventing increase of an access time due to the defective bit substitution.

Figure 1:
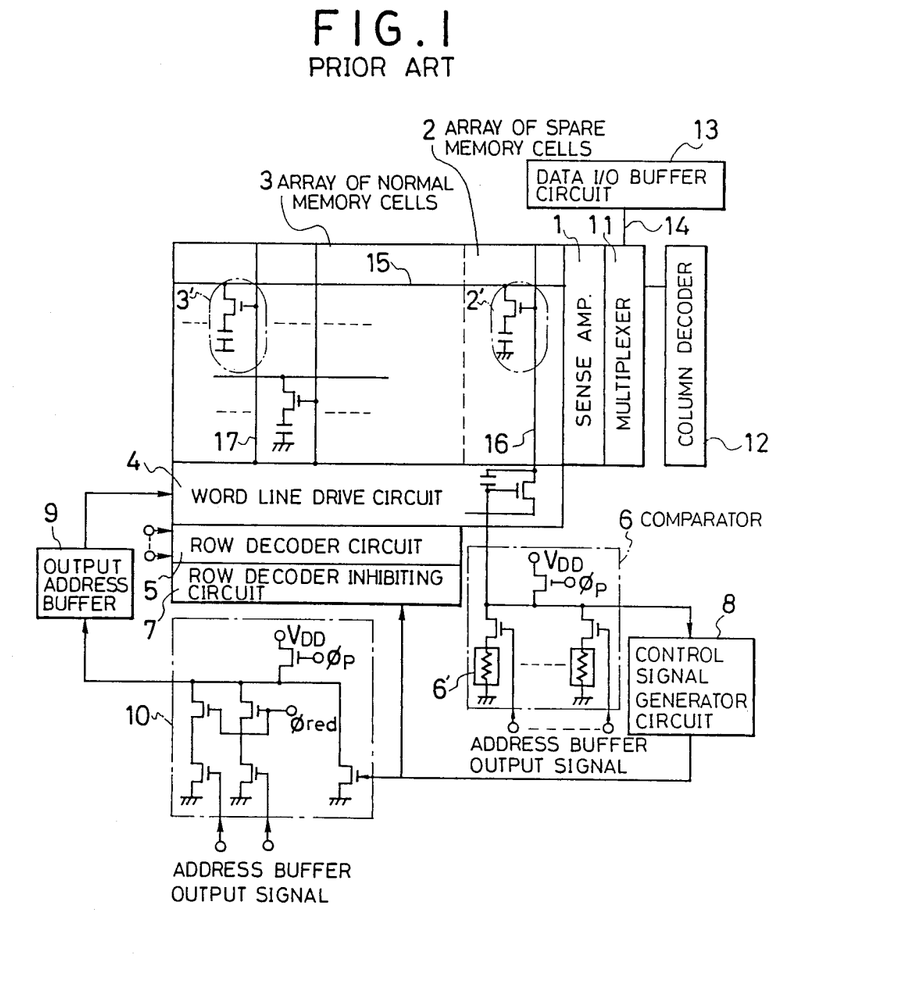
FIG. 1 is a schematic view showing a conventional semiconductor memory device.

FIG. 1 shows a conventional semiconductor memory with a redundancy configuration for correcting defect, as disclosed in Japanese Patent Application Publication No. 8520/1986. As illustrated, it comprises a row of sense amplifiers 1, an array 2 of spare memory cells 2', an array 3 of normal memory cells which may include a defective memory cell 3'. The memory device further comprises a word line drive circuit 4, a row decoder 5, a comparator 6 having signal path interrupter element 6' which may be in the form of a fuse blown or unblown by laser beam or the like depending on the corresponding bit of the address of a defective memory cell. More specifically, a set of signal path interrupter elements 6' are broken (blown) or unbroken (unblown) so that the code as represented by the set correspond to the address of the detective row for which the spare row is substituted. The signal path interrupter element 6' will be called a PROM element. The memory device further comprises a row decoder inhibiting circuit 7, a control signal generator circuit 8, a word line clock generator 9, a dummy decoder 10 for adjusting (by introducing delay) the timing of activation of the word line clock generator 9, a multiplexer 11, a column decoder 12 and a data input/output buffer circuit 13. The memory device further comprises data input/output lines 14, bit lines 15, spare word lines 16 and word lines 17. $o_p$ represents a precharge clock and ored is a signal which is at "L" level (low voltage level) only when redundancy correction of the defective bit is made.

The memory reading operation with a defective bit being corrected will be described. It is assumed that a defective memory cell 3' is replaced by a spare memory cell 2' on the same bit line 15 to which the defective memory cell 3' is also connected.

When an address buffer output signal (hereinafter abbreviated as "address signal") is input to the row decoder 5 and the comparator 6, the comparator 6 compares the input address with the address programmed by the PROM elements 6', and when finding coincidence, produces an output for activating the control signal generator circuit 8.

The control signal generator circuit 8 activates the row decoder inhibiting circuit 7 and the dummy decoder 10. The output of the dummy decoder 10 is established at the timing when the row decoder 5 stops its function upon operation of the row decoder inhibiting circuit 7. The output of the dummy decoder 10 activates the word line clock generator 9, whereupon the word line drive clock thereby generated activates the word line drive circuit 4. By then, the row decoder 5 has been inactivated by the row decoder inhibiting circuit 7 so that the word line drive circuit 4 connected to the row decoder 5 maintains low the word line 17 that is connected to the word line drive circuit 4.

The spare word line 16 is made high (high voltage level) by the word line drive circuit 4, and minute signal voltages corresponding to the respective cell data of one row of the spare memory cell array 2 connected to the spare word line 16 appear on all the bit lines. Thereafter the row of sense amplifiers 1 are activated to amplify the minute signals, which are then transmitted to the multiplexer 11. The multiplexer 11 selects the cell data of the spare memory cell 2' connected to the bit line 15 in accordance with the select signal of the column decoder 12, and the selected cell data is supplied through the data input/output line 14 to the data input/output buffer 13. The cell data is thus read out.

Although only one comparator 6 is illustrated, there are actually the same number of comparators 6 as the number of spare memory rows, and each comparator 6 produces a signal when the address buffer output signal is identical to the address programmed by the PROM elements 6' in the particular comparator 6.

Although only one each of the dummy decoder 10 and the word line clock generator 9 is illustrated, there are actually four dummy decoders 10 selected by the address buffer output signal, and four word line clock generators 9 corresponding to the respective dummy decoders 10.

The above-described semiconductor memory device has the following problems. That is the time required during the substitution for the defective bit for a series of circuit operations, i.e., for the control signal generator to operate and then for the row decoder inhibiting circuit to inactivate the row decoder, is added in time sequence to the access time that is required where no such substitution is effected. As a result, the overall access time is increased.

SUMMARY OF THE INVENTION

An object of the invention is to prevent the increase in the access time which occur in the conventional memory device at the time of effecting substitution for the defective bit.

A semiconductor memory device according to the invention is of a redundancy configuration having lines of main memory cells each storing data of one bit and a line of spare memory cells each storing data of one bit, the spare line being formed to substitute a defective line containing a defective main memory cell if there is such a defective line, the substitution by the spare line being achieved by having an arrangement by which the spare line is selected by the address of the defective line, in substitution for the defective line, said semiconductor memory device comprising;

a comparator comparing an address input to the memory device, with an address of the defective line which has been programmed in it, a spare line selector responsive to the output of the comparator for selecting the spare line when the input address is found to coincide with the programmed address, a line decoder responsive to the input address for selecting one of the lines of the normal memory cells, means responsive to the output of the comparator for producing a signal for inactivating the line decoder when the input address is found to coincide with the programmed address, and means for applying an input address to the line decoder and for applying an input address to the comparator before it applies the same input address to the line decoder.

With the arrangement described above, the comparison of the input address with the programmed address can be effected earlier than the application of the input address to the decoder. The time for which the decoder must wait for the completion of the comparison can therefore be reduced. As a result, the increase in the access time due to the employment of the redundancy configuration is restrained.

DETAILED DESCRIPTION OF THE PREFERRED EMBODIMENTS

A semiconductor memory device having a redundancy configuration of an embodiment of the invention will now be described with reference to FIG. 2. In the illustrated embodiment, the memory cell array is divided into two blocks BL1 and BL2. The two blocks BL1 and BL2 operate in a similar manner except that the block BL1 operates when the address signal RA9 is high, while the block BL2 operates when the address signal $\overline{RA9}$ is high. The following description will therefore be mostly directed to the block BL1 and its associated circuits, it being understood that similar description applies to the block BL2 and its associated circuits, except for the replacement of RA9 by $\overline{RA9}$.

It is assumed that the block BL1 has four columns of spare memory cells.

Figures 2, 2A:
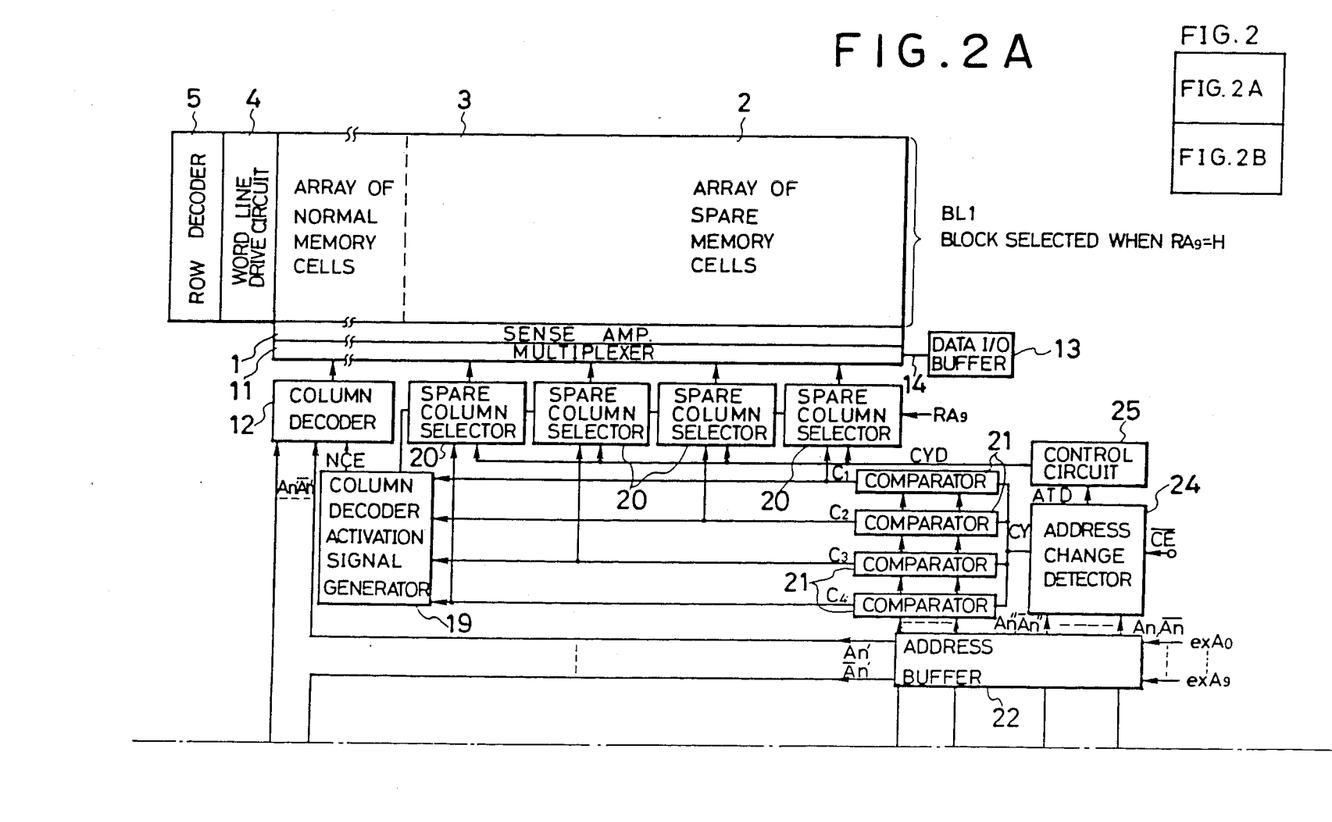
FIG. 2 is a schematic view showing a semiconductor memory device of an embodiment of the invention.
FIG. 2A is a schematic view showing a first portion of the semiconductor memory device illustrated in FIG. 2.
Figure 2B:
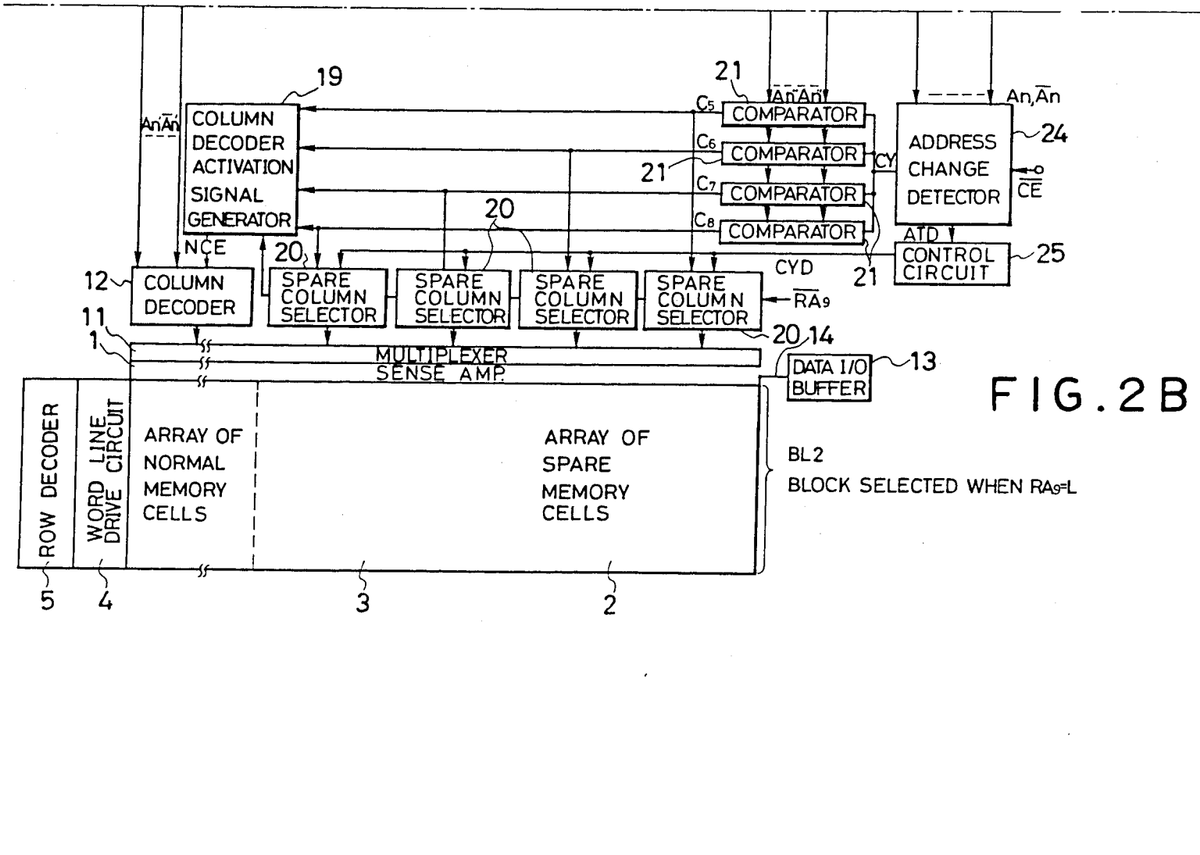
FIG. 2B is a schematic viewing showing a second portion of the semiconductor memory device illustrated in FIG. 2.

The memory device shown in FIG. 2 comprises a row 1 of sense amplifiers, an array 2 of spare memory cells, an array 3 of normal memory cells, a word line drive circuit 4, a row decoder 5, a multiplexer 11, a data input/output buffer 13, a data input/output line 14 and a column decoder 12. The memory device further comprises four comparators 21 provided in association with the four spare columns. Each comparator compares the input address with an address of a column containing a defective memory cell which has been programmed in it, and a column decoder activation signal generator 19, which is in the form of a NOR gate receiving an outputs C1 to C4 of the four comparators 21. When the output NCE of the column decoder activation signal generator 19 is low, the column decoder 12 is not activated so that none of the columns of the normal memory cells are selected. The memory device further comprises four spare column selectors 20 provided in association with the four spare columns. Each of the spare column selectors comprises an AND gate receiving the output signal Ci (i=1, 2, 3 or 4) of the corresponding comparator 21 and a signal CYD to be described later.

The memory cell further comprises an address buffer 22, an address change detector 24 for detecting change in the address, and a control circuit 25. $\overline{CE}$ denotes a signal which goes low after termination of sense operation. ATD denotes an output signal of the address change detector 24 which goes high when the signal $\overline{CE}$ is high or when the column address changes. CY denotes a signal which is a complement of the signal ATD. The signal CY is therefore made low for a predetermined time at the time of sense amplification or the change in the column address, thereby to initialize the comparator. CYD denotes a signal which goes high a predetermined delay time after the signal CY. exA0 to exA9 denote external input address signals. An', $\overline{An}'$ denote address buffer output signals for driving the decoder 12. An'', $\overline{An}''$ denote address buffer output signals for driving the comparator 21. An, $\overline{An}$ denote address buffer output signals for driving the address change detector 24. The signals An, $\overline{An}$ have smaller delay time from the external input address signal exA0 to exA9 than the signals An'', $\overline{An}''$, which in turn have smaller delay time from the external input stage than the signals An', $\overline{An}'$. This can be implemented by having the signals An, $\overline{An}$, An'', $\overline{An}''$ derived from intermediate stages of the address buffer, with the signals An, $\overline{An}$ derived from an earlier stages than the signals An'', $\overline{An}''$.

Figure 3:
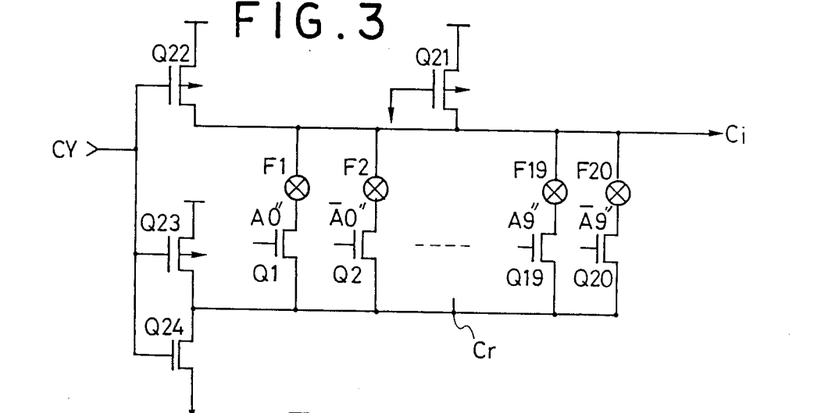
FIG. 3 is a circuit diagram showing an example of a comparator.

FIG. 3 shows an example of the comparator 21 for comparing input address with the address of the defective memory cell. It comprises PROM elements F1 to F20, which are selectively blown or unblown so that the set of the PROM elements represent or codify the address of the defective memory cell for which the corresponding spare memory cell should be substituted. When the spare column for which the comparator is provided is not used to substitute any normal memory cell, all the PROM elements are left unblown. The comparator 21 further comprises n-channel MOSFETs Q1 to Q20 and Q24 and p-channel MOSFETs Q21 to Q33. Thus, the comparator 21 of the illustrated example comprises a dynamic NOR gate comprising gate elements in the form of transistors for inputting address signals An'', $\overline{An}''$ and PROM elements in the form of fuse elements connected in series with the gate elements. The transistors Q1 to Q20 receive at their gate electrodes the respective bits of the address signal An'' and its complement $\overline{An}''$. Each of the series connections of the gate element and the PROM element forms a discharge path of the dynamic NOR gate and is connected across the node Ci forming the output of the comparator and a second node Cr. The transistor Q22 and Q23 serves to couple, when made conductive, the node Ci and the node Cr to a power supply V. The transistor Q24 serves to discharge, when made conductive, the node Cr.

The operation of the comparator 21 will be described with reference to FIG. 4. When there occurs a change in the column address at time t=t1 during a preparatory period of the column decoder, the signal ATD of the address change detector 24 is made high for a predetermined time period and the signal CY is made low for a predetermined time period. The transistors Q22, Q23 are then conductive while the transistor Q24 is nonconductive. The output node Ci of the comparator 21, i. e., the node to be precharged, and the node Cr are precharged through the transistors Q22 and Q23, respectively, to a high potential V. The two nodes Ci and Cr are made to have the same potential. Irrespective of the input signals to the transistors Q1 to Q20, the output Ci is kept high, so that the address buffer can be operated to supply the input address signal to the comparator, in parallel with the precharge.

When the signal CY goes high, the transistor Q24 conducts. If the input address does not coincide with the address of the defective memory cell preprogrammed on the set of PROM elements, at least one transistor in series with an unblown PROM element conducts, so that the output Ci is discharged through the series connection of the unblown PROM element and the conducting transistor to go low. When the input address coincides with the programmed address all the transistors in series with the unblown PROM elements are nonconductive, so that the output Ci is kept high.

When all the PROM elements are left unblown (because the corresponding spare column is not used for the substitution) the output Ci goes low so that the result is identical to the situation where there is no coincidence.

Thus, the comparison of the input address with the programmed address is carried out after the signal CY goes high. In the comparator of the illustrated example, the levels of the input address signals are established, during the precharge period when the signal CY is low, i. e., before the signal CY goes high. As a result, the comparison can be initiated immediately after the precharge. The output Ci of the comparator is input to the corresponding spare column selector 20 and the column decoder activation signal generator 19.

Figure 6:
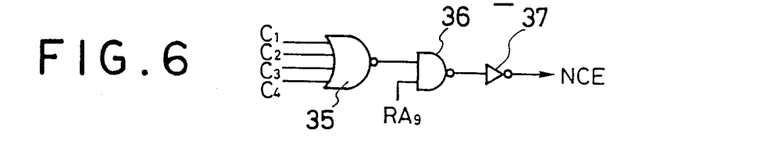
FIG. 6 is a block diagram showing an example of a column decoder activation signal generator.

An example of a column decoder activation signal generator 19 for the first block BL1 may comprise, as shown in FIG. 6, a NOR gate 35 receiving the outputs C1 to C4 from the four comparators 6, a NAND gate 36 receiving the output of the NOR gate 35 and the address signal RA9, and an inverter 37 receiving the output of the NAND gate 36.

The column decoder activation signal generator 19 for the block BL2 can be identical to that shown in FIG. 6 except that the NAND gate 36 receives the address signal $\overline{RA9}$ instead of RA9.

For the output NCE of the column decoder activation signal generator 19 to be high (to enable the column decoder to select one of the normal memory cells), all the outputs C1 to C4 of the comparators must be low (no coincidence between the input address (RA0 to RA8)) and the programmed addresses and the block (BL1 or BL2) for which the generator 19 is provided must be selected by the address signal RA9 or $\overline{RA9}$. When an address of a defective column is input, the output Ci (i=1,2,3 or 4) of one of the four comparators 6 is kept high so that the column decoder activation signal NCE is kept low. The result is that the column decoder is not operated and the normal memory cells are not selected.

When the input address does not coincide with any of the preprogrammed address, the signals C1 to C4 all go low at the time of the signal CY going high, so that the column decoder activation signal NCE goes high. The result is that the column decoder is operated and the normal memory cells are selected.

Figures 4, 5:
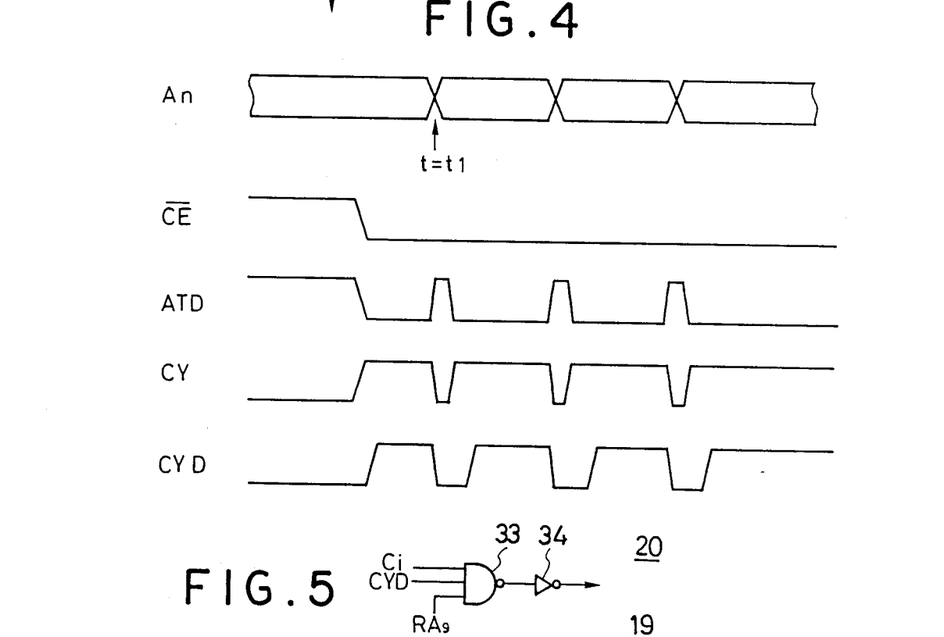
FIG. 4 is a time chart showing various signals in the comparator of FIG. 3.
FIG. 5 is a block diagram showing an example of a spare column selector 20 in FIG. 2.

Each of the spare column selectors 20 for the block BL1 may comprise, as shown in FIG. 5, a NAND gate 33 and an inverter 34. RA9 denotes an address signal for selecting one of the blocks BL1 and B12 of the memory cell array. CYD denotes a signal which goes high a predetermined time after the signal CY, that is when the level of the column decoder activation signal NCE has been established following the signal CY going high and operation of the comparator. The spare column selectors 20 for the second block BL2 can be indentical to that shown in FIG. 5 except that the NAND gate 33 receive the address signal $\overline{RA9}$ instead of RA9.

For the output to the spare column selector to be high, the output Ci of the associated comparator must be high, the signal CYD must be high and the block (BL1 or BL2) for which the selector 20 is provided must be selected. When the output of a spare column selector 20 is high, the corresponding spare column is selected.

As was described, the output signal of any of the comparators 21 are input to the spare column selectors 20 and the column decoder activation signal generator 19. Each of the spare column selectors 20 selects the associated spare column when the associated comparator produces an output Ci of the "H" level. The selection is made at the time when the signal CYD goes high.

When one of the four comparators 21 produces an output of the "H" level, the output NCE of the column decoder activation signal generator 19 is maintained low, so that the column decoder 12 does not select any of the normal memory cell columns. When the input address is not of a defective memory cell, the outputs of the comparators 21 are all low, and the column decoder activation signal NCE goes high, thereby activating the column decoder 12 and a normal memory cell column is selected.

Thus, when an address for a defective column is input, a spare column is selected and the defective column is prevented from being selected. The selection of the column cannot take place before the comparison at the comparator, and the subsequent establishment of the column decoder activation signal. The selection of the column is retarded compared with a memory device without the redundancy.

However, with the arrangement described above, the comparator is connected to receive address signals from an intermediate stage of the address buffer which has a smaller delay than the output of the final stage of the address buffer, with respect to the input stage, the time at which the level of the column decoder activation signal is established is made earlier and the increase of the access time because of the redundancy configuration is reduced.

In the embodiment described, the column decoder is directly driven by the output of the address buffer, so that the address buffer must have a number of stages for sufficient amplification. It is therefore convenient to derive an intermediate stage output for the comparison.

Figures 7, 7A:
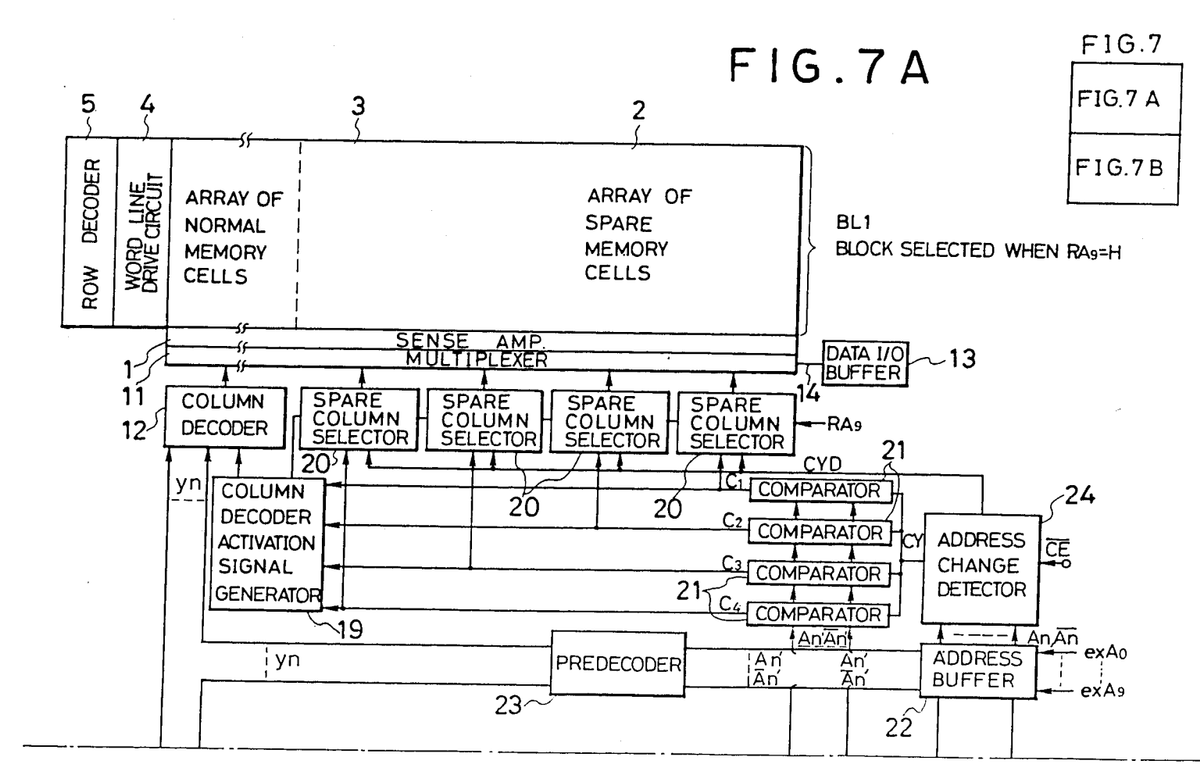
FIG. 7 is a schematic view showing a semiconductor memory device of a second embodiment of the invention.
FIG. 7A is a schematic view showing a first portion of the semiconductor memory device illustrated in FIG. 7.
Figure 7B:
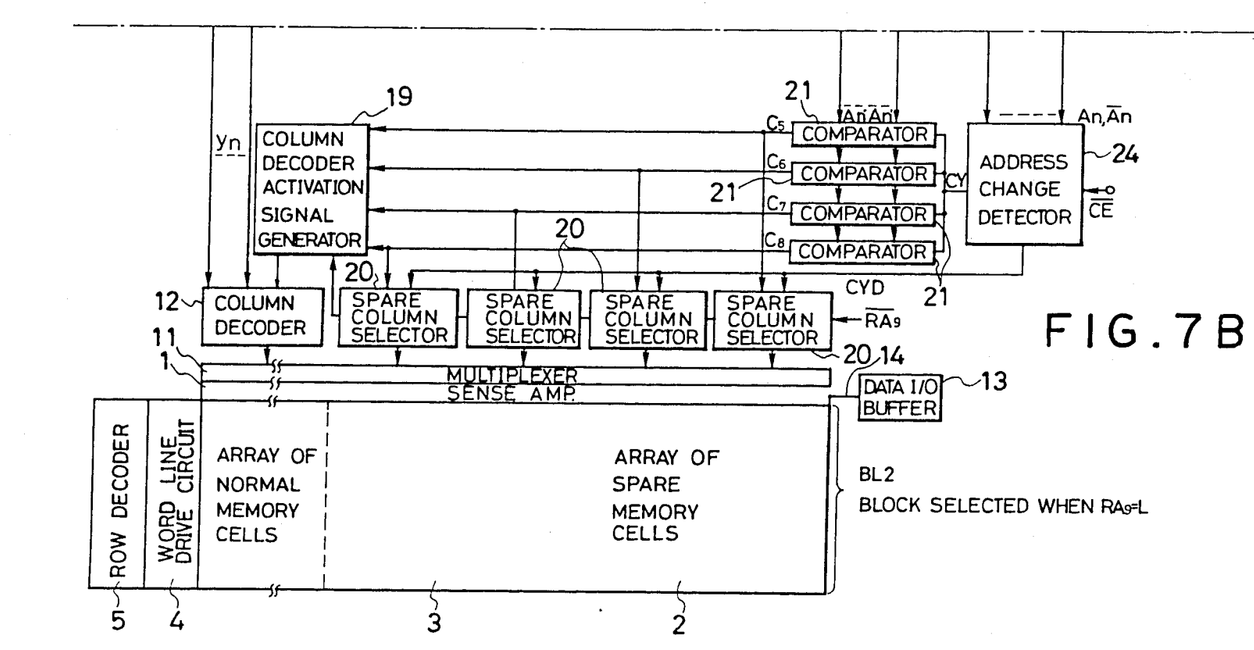
FIG. 7B is a schematic view showing a second portion of the semiconductor memory device illustrated in FIG. 7.

A second embodiment of the invention will be described with reference to FIG. 7. In this embodiment, a predecoder 23 is provided to be driven by the outputs An', $\overline{An}'$ of the address buffer 22 and to drive the column decoder by its output yn. The output of the address buffer is supplied to the comparators 21 for the comparison.

Since the address buffer of this embodiment is required to drive the predecoder, its output may be much smaller than in the case of FIG. 1 or FIG. 2. The delay through the address buffer is therefore much smaller.

The description has been made with reference to a memory having spare columns. The invention is also applicable to a memory having spare rows. The term "line" in the appended claims should be construed to mean "row" as well as "column".

The description has been made with reference to a redundancy configuration of a dynamic RAM having a static column mode. The invention is also applicable to a redundancy configuration of rows or columns of static RAMs.

The invention has been described with reference to a type of memory that has a (column) decoder activation signal generator 19 which supplies a signal NCE of "H" level except when any of the comparators 6 produces a signal Ci. But the invention is also applicable to the type of memory having a (row) decoder inhibiting circuit 7 which produces a signal for inactivating the row decoder 5.

As has been described, according to the semiconductor memory device of the invention, the input address is applied to the comparator earlier than to the decoder, so that the delay of the address signal as supplied to the comparator is made smaller than the delay of the address signal as supplied to the decoder for the normal memory cells. The increase of the access time can therefore be reduced. An additional advantage of the embodiments described is that the node of the comparator to be precharged and the node to which the precharged electric charge on the above-mentioned node flows through the PROM element and a gate element are made to have the same potential. As a result, the address buffer can be operated to supply an address signal to the comparator, during the precharge period. Accordingly, comparison at the comparator can be carried out immediately after the precharge period. In the conventional arrangement, it was necessary to cause the address buffer to operate after the precharge period, and then to have the comparison take place. The access time can therefore be reduced.

What is claimed is:

1. A semiconductor memory device of a redundancy configuration having lines of main memory cells each storing data of one bit and a line of spare memory cells each storing data of one bit, the spare line being formed to substitute a defective line containing a defective main memory cell if there is such a defective line, the substitution by the spare line being achieved by having an arrangement by which the spare line is selected by the address of the defective line, in substitution for the defective line, said semiconductor memory device comprising a comparator comparing an input address received by the memory device, with an address of the defective line which has been programmed in said comparator, a spare line selector responsive to the output of the comparator for selecting the spare line when the input address is found to coincide with the programmed address, a line decoder responsive to the input address for selecting one of the lines of the main memory cells, means responsive to the output of the comparator for producing a signal for inactivating the line decoder when the input address is found to coincide with the programmed address, and means for applying the input address to the line decoder and to the comparator so that said comparator receives said input address a predetermined time period before said line decoder receives said input address.

2. A device according to claim 1, wherein said means for applying the input address comprises an address buffer having a plurality of cascaded stages, and an output derived from an intermediate stage is applied to the comparator as said input address, while an output derived from a stage succeeding, in position, the first-mentioned intermediate stage is applied to the line decoder as said input address.

3. A device according to claim 1, wherein said means for applying the input address comprises an address buffer and a predecoder connected to receive the output of the address buffer, and the output of the address buffer is applied to the comparator while the output of the predecoder is applied to the line decoder.

4. A semiconductor memory device of a redundancy configuration having lines of main memory cells each storing data of one bit and a line of spare memory cells each storing data of one bit, the spare line being formed to substitute a defective line containing a defective main memory cell if there is such a defective line, the substitution by the spare line being achieved by having an arrangement by which the spare line is selected by the address of the defective line, in substitution for the defective line, said semiconductor memory device comprising:

a comparator for comparing an input address received by the memory device, with an address of the defective line which has been programmed in said comparator;

a spare line selector responsive to the output of the comparator for selecting the spare line when the input address is found to coincide with the programmed address;

a line decoder responsive to the input address for selecting one of the lines of the main memory cells;

means responsive to the output of the comparator for producing a signal for inactivating the line decoder when the input address is found to coincide with the programmed address;

means for applying the input address to the line decoder and to the comparator so that said comparator receives said input address a predetermined time period before said line decoder receives said input address; and wherein said comparator comprises a dynamic NOR gate having discharge paths each formed of a gate element receiving a bit of the input address or an inversion of said bit to be opened or closed depending on the value of the particular bit of the input address currently applied, and PROM elements each being connected in series with the gate element, the PROM elements of the discharge paths being programmed to represent an address of a defective line, the dynamic NOR gate having a first node forming an output thereof and a second node, each of the series connections of the PROM element and the gate element being connected across the first and the second nodes, and equalizing means for causing the potential on the second node to be substantially identical with the potential on the first node during a precharge period.

5. A device according to claim 4, wherein the gate element of each discharge path comprises a transistor having a gate electrode connected to receive a bit of the input address or its complement.

6. A device according to claim 5, wherein each of the PROM elements comprises a fuse which has been blown or unblown depending on the corresponding bit.

7. A device according to claim 4, wherein said comparator further comprises means for precharging the first node during the precharge period.

8. A device according to claim 7, wherein said precharging means comprises a transistor coupling the first node to a power supply and being made conductive during the precharge period.

9. A device according to claim 8, wherein said precharging means further comprises an additional transistor coupling the second node to the power supply during the precharge period.

10. A device according to claim 4, wherein said means for applying the input address comprises an address buffer having a plurality of cascaded stages, and an output derived from an intermediate stage of said plurality of cascaded stages being applied to the comparator as said input address, while an output derived from a stage succeeding, in position, the first-mentioned intermediate stage is applied to the line decoder as said input address.

11. A device according to claim 4, wherein said means for applying the input address comprises an address buffer and a predecoder connected to receive the output of the address buffer, and the output of the address buffer being applied to the comparator while the output of the predecoder is applied to the line decoder.

12. A semiconductor memory device of a redundancy configuration having lines of main memory cells each storing data of one bit and a line of spare memory cells each storing data of one bit, the spare line being formed to substitute a defective line containing a defective main memory cell if there is such a defective line, the substitution by the spare line being achieved by having an arrangement by which the spare line is selected by the address of the defective line in substitution for the defective line, said semiconductor memory device comprising:

a comparator comparing an input address received by the memory device with an address of the defective line which has been programmed in said comparator;

a spare line selector responsive to the output of the comparator for selecting the spare line when the input address is found to coincide with the programmed address;

a line decoder responsive to the input address for selecting one of the lines of the main memory cells;

means responsive to the output of the comparator for producing a signal for inactivating the line decoder when the input address is found to coincide with the programmed address;

means for applying the input address to the line decoder and to the comparator so that said comparator receives said input address a predetermined time period before said line decoder receives said input address; and means for precharging the output of the comparator during a precharge period.

13. A device according to claim 12, wherein said precharging means comprises a transistor coupling the output of the comparator to a power supply and being made conductive during a precharge period.

14. A device according to claim 12, and further comprising an equalizing means connected to a reference node of the comparator for causing the potential on the reference node to be substantially identical to the potential at the output of the comparator during a precharge period of said precharging means, and wherein said equalizing means comprises a transistor coupling the reference node to a power supply during the precharge period.

15. A device according to claim 12, wherein said means for applying the input address comprises an address buffer having a plurality of cascaded stages, and an output derived from an intermediate stage of said plurality of cascaded stages being applied to the comparator as said input address, while an output derived from a stage succeeding, in position, the first-mentioned intermediate stage is applied to the line decoder as said input address.

16. A device according to claim 12, wherein said means for applying the input address comprises an address buffer and a predecoder connected to receive the output of the address buffer, and the output of the address buffer being applied to the comparator while the output of the predecoder is applied to the line decoder.

* * * * *